(12) United States Patent
Sparrowe et al.

(10) Patent No.: US 8,398,895 B2
(45) Date of Patent: Mar. 19, 2013

(54) CONJUGATED POLYMERS AND THEIR USE AS ORGANIC SEMICONDUCTORS

(75) Inventors: David Sparrowe, Bournemouth (GB); Niels Schulte, Kelkheim (DE); Frank Egon Meyer, Winchester (GB)

(73) Assignee: Merck Patent Gesellschaft mit beschrankter Haftung, Darmstadt (DE)

( * ) Notice: Subject to any disclaimer, the term of this patent is extended or adjusted under 35 U.S.C. 154(b) by 0 days.

(21) Appl. No.: 13/322,625

(22) PCT Filed: May 4, 2010

(86) PCT No.: PCT/EP2010/002695
§ 371 (c)(1),
(2), (4) Date: Nov. 28, 2011

(87) PCT Pub. No.: WO2010/136112
PCT Pub. Date: Dec. 2, 2010

(65) Prior Publication Data
US 2012/0068121 A1    Mar. 22, 2012

(30) Foreign Application Priority Data

May 29, 2009    (EP) .................................... 09007179

(51) Int. Cl.
*H01B 1/00*    (2006.01)

(52) U.S. Cl. .......... 252/500; 252/501.1; 528/8; 524/610

(58) Field of Classification Search ................... 136/256; 252/301.6 R, 301.4 R; 313/503; 372/43.01
See application file for complete search history.

(56) References Cited

U.S. PATENT DOCUMENTS

| | | |
|---|---|---|
| 2006/0046092 A1 | 3/2006 | Towns et al. |
| 2007/0205714 A1 | 9/2007 | Busing et al. |
| 2009/0149627 A1 | 6/2009 | Pan et al. |
| 2009/0247728 A1 | 10/2009 | Pan et al. |

FOREIGN PATENT DOCUMENTS

| | | |
|---|---|---|
| WO | WO 2004/041901 A1 | 5/2004 |
| WO | WO 2005/104264 A1 | 11/2005 |
| WO | WO 2007/131582 A1 | 11/2007 |
| WO | WO 2008/009343 A1 | 1/2008 |

OTHER PUBLICATIONS

International Search Report of PCT/EP2010/002695 (Jul. 16, 2010).
J. Kim et al., "Low-Bandgap Poly(4H-Cyclopenta[def]Phenanthrene) Derivatives with 4,7-Dithienyl-2,1,3-Benzothiadiazole Unit for Photovoltaic Cells", Polymer, vol. 51, No. 2 (2010) pp. 390-396.
A. C. Grimsdale et al., "Correlation Between Molecular Structure, Microscopic Morphology, and Optical Properties of Poly(Tetraalkylindenofluorene)s**", Advanced Functional Materials, vol. 12, No. 10 (Oct. 1, 2002) pp. 729-733.
D. Marsitzky et al., "Poly-2,8-(Indenofluorene-Co-Anthracene)—A Colorfast Blue-Light-Emitting Random Copolymer", Advanced Materials, vol. 13, No. 14 (Jul. 18, 2001) pp. 1096-1099.

*Primary Examiner* — Shane Fang
(74) *Attorney, Agent, or Firm* — Millen, White, Zelano & Branigan, P.C.

(57) ABSTRACT

The invention relates to conjugated polymers that comprise phenanthrene and/or indenofluorene units and are free of amine-containing units, to methods of their preparation, to the use of the polymers in organic electronic (OE) devices, and to OE devices comprising the polymers.

19 Claims, No Drawings

CONJUGATED POLYMERS AND THEIR USE AS ORGANIC SEMICONDUCTORS

FIELD OF THE INVENTION

The invention relates to conjugated polymers that comprise phenanthrene and/or indenofluorene units and are free of amine-containing units, to methods of their preparation, to the use of the polymers in organic electronic (OE) devices, and to OE devices comprising the polymers.

BACKGROUND AND PRIOR ART

In recent years, there has been development of organic semiconducting (OSC) materials in order to produce more versatile, lower cost electronic devices. Such materials find application in a wide range of devices or apparatus, including organic field effect transistors (OFETs), organic light emitting diodes (OLEDs), photodetectors, organic photovoltaic (OPV) cells, sensors, memory elements and logic circuits to name just a few. The organic semiconducting materials are typically present in the electronic device in the form of a thin layer, for example less than 1 micron thick.

The performance of OFET devices is principally based upon the charge carrier mobility of the semiconducting material and the current on/off ratio, so the ideal semiconductor should have a low conductivity in the off state, combined with a high charge carrier mobility ($>1\times10^{-3}$ cm$^2$V$^{-1}$s$^{-1}$). In addition, it is important that the semiconducting material is relatively stable to oxidation i.e. it has a high ionisation potential, as oxidation leads to reduced device performance. Further requirements for the semiconducting material are a good processability, especially for large-scale production of thin layers and desired patterns, and high stability, film uniformity and integrity of the organic semiconductor layer.

In prior art various materials have been proposed for use as OSCs in OFETs, including small molecules like for example pentacene, and polymers like for example polyhexylthiophene. However, the materials and devices investigated so far do still have several drawbacks, and their properties, especially the processability, charge-carrier mobility, on/off ratio and stability do still leave room for further improvement.

For example, most organic amorphous semiconductors currently available are limited to mobilities in the range of $10^{-2}$ cm$^2$/Vs. Amorphous polymers are useful for example for the large scale manufacture of organic transistors (TFTs or OFETs) for use in the backplanes of active matrix driven displays, especially flexible displays, by using solution processable techniques.

There is especially a strong need for improved p-type organic semiconductor for application in OE devices like OFETs and OPVs that can yield improved device performance. The currently available p-type OSC materials show deficiencies in light absorption, oxidative stability and charge-carrier mobility.

In particular, there is a need for improved p-type OSCs which have a high charge carrier mobility, a high solubility in organic solvents, a good processability for the device manufacture process, a high oxidative stability, a long lifetime in electronic devices, and which are easy to synthesize.

One aim of the present invention is to provide new p-type OSC materials, especially for use in OFETs and OPV devices, fulfilling the above-mentioned requirements. Another aim is to extend the pool of OSC materials available to the expert. Other aims of the present invention are immediately evident to the expert from the following detailed description.

The inventors of the present invention have found that these aims can be achieved by providing conjugated polymers that contain one or more phenanthrene and/or indenofluorene units but do not contain any amine-containing unit. It was also found that such conjugated polymers, when used as p-type semiconductors in OFETs, do surprisingly give better performance, in particular a higher charge carrier mobility, than analogous polymers containing amine groups.

Conjugated polymers containing phenanthrene or indenofluorene units have been disclosed for example in WO 2005/104264 A1 or WO 2004/041901 A1 for use as electroluminescent material in OLED devices. However, the preferred polymers disclosed therein are copolymers that do further comprise structural units with one or more amine groups, in particular triarylamine units. The document does neither disclose nor suggest that polymers that are free of amine-containing units are especially suitable as p-type semiconductors in OFETs or OPV devices.

SUMMARY OF THE INVENTION

The invention relates to a conjugated polymer comprising one or more identical or different repeating units selected from the following formulae:

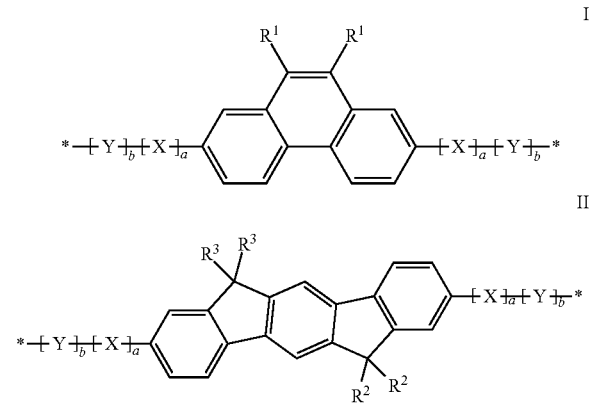

wherein
R$^1$ on each occurrence identically or differently, denotes H, a straight-chain, branched or cyclic alkyl group having 1 to 40 C atoms, which is unsubstituted or substituted by one or more groups R, and in which one or more C atoms are optionally replaced by O, S, CO, CO—O, O—CO, O—CO—O, CR=CR or C≡C such that O- and/or S-atoms are not linked directly to each other, and preferably heteroatoms are not bonded directly to the phenanthrene unit in formula I, and in which one or more H atoms are optionally replaced by F, Cl, Br, I or CN, or R$^1$ denotes an aryl or heteroaryl group having 2 to 40 C atoms that is unsubstituted or substituted by one or more groups R, or a combination of a plurality of these groups; and wherein two groups R$^1$ may also form a further mono- or polycyclic, aliphatic group with one another, R$^{2,3}$ independently of each other have one of the meanings given for R$^1$, X, Y on each occurrence identically or differently, and independently of each other, denote CR=CR, C≡C, or a divalent aryl or heteroaryl group having 2 to 40 C atoms that is unsubstituted or substituted by one or more groups R$^1$, R is on each occurrence, identically or differently, H, a straight-chain, branched or cyclic alkyl or alkoxy group having 1 to 22 C atoms, in which one or more C atoms are optionally replaced by O, S, CO, CO—O, O—CO, O—CO—O, CR$^0$=CR$^0$, C≡C such that O- and/or S-atoms are not linked directly to each other, and in which one or more H atoms are optionally replaced by F, Cl, Br, I or CN, or R is an aryl, heteroaryl, aryloxy or heteroaryloxy group having 5 to 40 C atoms that is unsubstituted or substituted by one or more non-aromatic group R$^0$; two or more of the groups R may also form a ring system with one another and/or with R$^0$; or R is F, Cl, Br, I, CN, Sn(R$^0$)$_3$, Si(R$^0$)$_3$ or B(R$^0$)$_2$, R$^0$ is on each occurrence, identically or differently, H or an aliphatic or aromatic hydrocarbon group having 1 to 20 C atoms; two groups R$^0$ may also form a ring together with the hetero atom (Sn, Si or B) to which they are attached, a, b on each occurrence identically or differently, and independently of each other, denote 0, 1 or 2, characterized in that the polymer does not contain a diarylamine or triarylamine group.

The invention further relates to a polymer blend comprising one or more polymers according to the present invention and one or more polymers, preferably selected from polymers having semiconducting, charge transport, hole/electron transport, hole/electron blocking, electrically conducting, photoconducting or light emitting properties.

The invention further relates to a formulation comprising one or more polymers or polymer blends according to the present invention and one or more solvents, preferably selected from organic solvents.

The invention further relates to the use of polymers, polymer blends and formulations according to the present invention as charge transport, semiconducting, electrically conducting, photoconducting or light emitting material in optical, electrooptical, electronic, electroluminescent or photoluminescent components or devices.

The invention further relates to a charge transport, semiconducting, electrically conducting, photoconducting or light emitting material or component comprising one or more polymers, polymer blends of formulations according to the present invention.

The invention further relates to an optical, electrooptical or electronic component or device comprising one or more polymers, polymer blends, formulations, components or materials according to the present invention.

The optical, electrooptical, electronic electroluminescent and photoluminescent components or devices include, without limitation, organic field effect transistors (OFET), thin film transistors (TFT), integrated circuits (IC), logic circuits, capacitors, radio frequency identification (RFID) tags, devices or components, organic light emitting diodes (OLED), organic light emitting transistors (OLET), flat panel displays, backlights of displays, organic photovoltaic devices (OPV), solar cells, laser diodes, photoconductors, photodetectors, electrophotographic devices, electrophotographic recording devices, organic memory devices, sensor devices, charge injection layers, charge transport layers or interlayers in polymer light emitting diodes (PLEDs), Schottky diodes, planarising layers, antistatic films, polymer electrolyte membranes (PEM), conducting substrates, conducting patterns, electrode materials in batteries, alignment layers, biosensors, biochips, security markings, security devices, and components or devices for detecting and discriminating DNA sequences.

Especially preferred components and devices are TFTs, OFETs and OPV devices.

DETAILED DESCRIPTION OF THE INVENTION

The polymers according to the present invention are easy to synthesize and exhibit several advantageous properties, like a high charge carrier mobility, a high solubility in organic solvents, a good processability for the device manufacture process, a high oxidative stability and a long lifetime in electronic devices.

In particular, the polymers according to the present invention show a significantly higher charge carrier mobility than similar polymers comprising units with an amine group, like for example polymers containing di- or triarylamine units.

The polymer according to the present invention are characterized in that they do not contain a repeating unit that contains a diarylamine or triarylamine group.

Preferably the polymers according to the present invention do not contain a repeating unit, which may be selected of formula I or II or may be any other repeating unit, which contains an amine or imine group.

The term "amine or imine group" means a group containing a radical

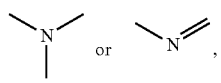

for example a group which is selected from the formulae NR$^x_3$, N(R$^x$)=R$^x$ or R$^x$—N=N—R$^x$, wherein R$^x$ is H, a carbyl or hydrocarbyl rest or a heteroatom, including but not limited to trialkylamine, dialkylamine, aryl-dialkylamine, alkyl-diarylamine, diarylamine and triarylamine groups, or for example a group which is selected from an N-heterocyclic or N-heteroaromatic group with or without one or more further heteroatoms (different from N) like for example oxygen, sulphur or selen.

Preferably the polymers of the present invention do not contain a repeating unit that contains a unit selected from the following formulae

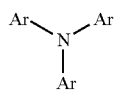

wherein Ar is an aryl or heteroaryl group, preferably an aryl group, having 2 to 40 C atoms that is unsubstituted or substituted by one or more groups R as defined above, preferably phenyl that is optionally substituted by R, and wherein two or three Ar groups may also also form a further mono- or polycyclic ring system with one another, and wherein the unit is linked to adjacent units in the polymer via two of the Ar groups, and

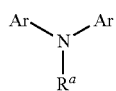

wherein Ar is as defined above and R$^a$ is H or non-aromatic carbyl or hydrocarbyl, preferably straight-chain, branched or cyclic alkyl group having 1 to 40 C atoms, which is unsubstituted or substituted by one or more groups R as defined above, and in which one or more non-adjacent C atoms are optionally replaced by O, S, CO, O—CO, CO—O, O—CO—O, CR=CR or C≡C, wherein the two Ar groups may also form a further mono- or polycyclic ring system with one another, and wherein the unit is linked to adjacent units in the polymer via the Ar and/or $R^a$ group, preferably via the two Ar groups, like for example the following unit

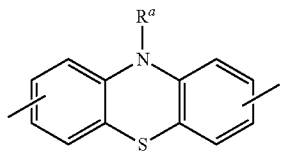

wherein $R^a$ is as defined above and the two bonds denote the links to adjacent repeating units in a polymer.

The term "polymer" generally means a molecule of high relative molecular mass, the structure of which essentially comprises the multiple repetition of units derived, actually or conceptually, from molecules of low relative molecular mass (PAC, 1996, 68, 2291). The term "oligomer" generally means a molecule of intermediate relative molecular mass, the structure of which essentially comprises a small plurality of units derived, actually or conceptually, from molecules of lower relative molecular mass (PAC, 1996, 68, 2291). In a preferred sense according to the present invention a polymer means a compound having >1, preferably >10 repeating units, and an oligomer means a compound with >1 and <20, preferably ≦10, repeating units.

The terms "unit", "repeating unit" and "monomeric unit" mean the constitutional repeating unit (CRU), which is the smallest constitutional unit the repetition of which constitutes a regular macromolecule, a regular oligomer molecule, a regular block or a regular chain (PAC, 1996, 68, 2291).

The term "leaving group" means an atom or group (charged or uncharged) that becomes detached from an atom in what is considered to be the residual or main part of the molecule taking part in a specified reaction (see also PAC, 1994, 66, 1134).

The term "conjugated" means a compound containing mainly C atoms with $sp^2$-hybridisation (or optionally also sp-hybridisation), which may also be replaced by hetero atoms. In the simplest case this is for example a compound with alternating C—C single and double (or triple) bonds, but does also include compounds with units like 1,3-phenylene. "Mainly" means in this connection that a compound with naturally (spontaneously) occurring defects, which may lead to interruption of the conjugation, is still regarded as a conjugated compound.

Unless stated otherwise, the molecular weight is given as the number average molecular weight $M_n$ or weight average molecular weight $M_w$, which is determined by gel permeation chromatography (GPC) against polystyrene standards. The degree of polymerization (n) means the number average degree of polymerization, given as $n=M_n/M_U$, wherein $M_U$ is the molecular weight of the single repeating unit.

The structural units of formula I and II may be symmetrically substituted, i.e. wherein the groups $R^1$, $R^2$ or $R^3$, respectively, are identical and/or X, Y, a and b on both sides of the central group in formula I or II are identical, or asymmetrically substituted, i.e. wherein different substituents R or $R^{1-3}$ may be present on a unit and/or the substituents X and Y do only occur on one side and/or, if present or both sides, are different from each other.

Aryl groups may be mononuclear, i.e. having only one aromatic ring (like for example phenyl or phenylene), or polynuclear, i.e. having two or more aromatic rings which may be fused (like for example napthyl or naphthylene), individually covalently linked (like for example biphenyl), and/or a combination of both fused and individually linked aromatic rings. Preferably the aryl group is an aromatic group which is conjugated over the entire group.

Aryl and heteroaryl preferably denote a mono-, bi- or tricyclic aromatic or heteroaromatic group with up to 25 C atoms that may also comprise condensed rings and is optionally substituted.

Preferred aryl groups Ar include, without limitation, benzene, biphenylene, triphenylene, [1,1':3',1"]terphenyl-2'-ylene, naphthalene, anthracene, binaphthylene, phenanthrene, pyrene, dihydropyrene, chrysene, perylene, tetracene, pentacene, benzpyrene, fluorene, indene, cis- or trans-indenofluorene, spirobifluorene, etc.

Preferred heteroaryl groups Ar include, without limitation, 5-membered rings like pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings like pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, and fused systems like carbazole, indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, dithienopyridine, isobenzothiophene, dibenzothiophene, benzothiadiazothiophene, or combinations thereof.

Preferred aryl and heteroaryl groups in the definitions of R, $R^0$, $R^1$, $R^2$, $R^3$ are selected from the preferred aryl and heteroaryl groups as mentioned above for Ar, very preferably excluding those heteroaryl groups having one or more N-heteroatoms.

The aryl and heteroaryl groups may be substituted with alkyl, alkoxy, thioalkyl, fluoro, fluoroalkyl or further aryl or heteroaryl substituents.

Halogen is F, Cl, Br or I.

Preferred alkyl groups include, without limitation, methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, 2-ethylhexyl, n-heptyl, cycloheptyl, n-octyl, cyclooctyl, dodecanyl, tetradecyl, hexadecyl, trifluoromethyl, perfluoro-n-butyl, 2,2,2-trifluoroethyl, perfluorooctyl, perfluorohexyl etc.

Preferred alkenyl groups include, without limitation, ethenyl, propenyl, butenyl, pentenyl, cyclopentenyl, hexenyl, cyclohexenyl, heptenyl, cycloheptenyl, octenyl, cyclooctenyl etc.

Preferred alkynyl groups include, without limitation, ethynyl, propynyl, butynyl, pentynyl, hexynyl, octynyl etc.

Preferred alkoxy groups include, without limitation, methoxy, ethoxy, 2-methoxyethoxy, n-propoxy, i-propoxy, n-butoxy, i-butoxy, s-butoxy, t-butoxy, 2-methylbutoxy, n-pentoxy, n-hexoxy, n-heptoxy, n-octoxy etc.

Preferred arylalkyl groups include, without limitation, 2-tolyl, 3-tolyl, 4-tolyl, 2,6-dimethylphenyl, 2,6-diethylphenyl, 2,6-di-i-propylphenyl, 2,6-di-t-butylphenyl, o-t-butylphenyl, m-t-butylphenyl, p-t-butylphenyl, 4-phenoxyphenyl, 4-fluorophenyl, 3-carbomethoxyphenyl, 4-carbomethoxyphenyl etc.

Preferred alkylaryl groups include, without limitation, benzyl, ethylphenyl, 2-phenoxyethyl, propylphenyl, diphenylmethyl, triphenylmethyl or naphthalinylmethyl.

Preferred aryloxy groups include, without limitation, phenoxy, naphthoxy, 4-phenylphenoxy, 4-methylphenoxy, biphenyloxy, anthracenyloxy, phenanthrenyloxy etc.

If one of R, $R^0$ and $R^{1-3}$ is an alkyl or alkoxy radical, i.e. where the terminal $CH_2$ group is replaced by —O—, this may be straight-chain or branched. It is preferably straight-chain, has 2 to 8 carbon atoms and accordingly is preferably ethyl, propyl, butyl, pentyl, hexyl, heptyl, octyl, ethoxy, propoxy, butoxy, pentoxy, hexyloxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example. Especially preferred are n-hexyl and n-dodecyl.

If one of R, $R^0$ and $R^{1-3}$ is an alkyl group wherein one or more $CH_2$ groups are replaced by —CH=CH—, this may be straight-chain or branched. It is preferably straight-chain, has 2 to 12 C-atoms and accordingly is preferably vinyl, prop-1-, or prop-2-enyl, but-1-, 2- or but-3-enyl, pent-1-, 2-, 3- or pent-4-enyl, hex-1-, 2-, 3-, 4- or hex-5-enyl, hept-1-, 2-, 3-, 4-, 5- or hept-6-enyl, oct-1-, 2-, 3-, 4-, 5-, 6- or oct-7-enyl, non-1-, 2-, 3-, 4-, 5-, 6-, 7- or non-8-enyl, dec-1-, 2-, 3-, 4-, 5-, 6-, 7-, 8- or dec-9-enyl, undec-1-, 2-, 3-, 4-, 5-, 6-, 7-, 8-, 9- or undec-10-enyl, dodec-1-, 2-, 3-, 4-, 5-, 6-, 7-, 8-, -9, -10 or undec-11-enyl. The alkenyl group may comprise C=C- bonds with E- or Z-configuration or a mixture thereof.

If one of R, $R^0$ and $R^{1-3}$ is oxaalkyl, i.e. where one $CH_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

If one of R, $R^0$ and $R^{1-3}$ is thioalkyl, i.e where one $CH_2$ group is replaced by —S—, is preferably straight-chain thiomethyl (—$SCH_3$), 1-thioethyl (—$SCH_2CH_3$), 1-thiopropyl (=—$SCH_2CH_2CH_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the $CH_2$ group adjacent to the $sp^2$ hybridised vinyl carbon atom is replaced.

If one of R, $R^0$ and $R^{1-3}$ is fluoroalkyl or fluoroalkoxy, it is preferably a straight-chain group $(O)C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$, or the corresponding fluoroalkoxy group.

X is preferably CH=CH or C≡C.

Y is preferably a divalent aromatic or heteroaromatic ring system having 4 to 25, most preferably 6 to 16 C atoms, which is optionally substituted by one or more radicals R.

Especially preferred are units of formula I and II selected from the following preferred embodiments or any combinations thereof a is 0 or 1, b is 0, 1 or 2, X is CR=CR or with R having one of the meanings of formula I or of the preferred meanings given above and below, Y is a divalent aryl or heteroaryl group having 2 to 40 C atoms that is unsubstituted or substituted by one or more groups $R^1$, with $R^1$ having one of the meanings of formula I or of the preferred meanings given above and below, b is 0 and a is 0, b is 0 and a is 1, b is 1 and a is 0, b is 1 and a is 1, in one of the two groups $[Y]_b$—$[X]_a$ and $[X]_a$—$[Y]_b$ a is 0 and b is 1 and in the other of the two groups $[Y]_b$—$[X]_a$ and $[X]_a[Y]_b$ a is 1 and b is 1, Very preferably the units of formula I are selected from the group consisting of the following subformulae:

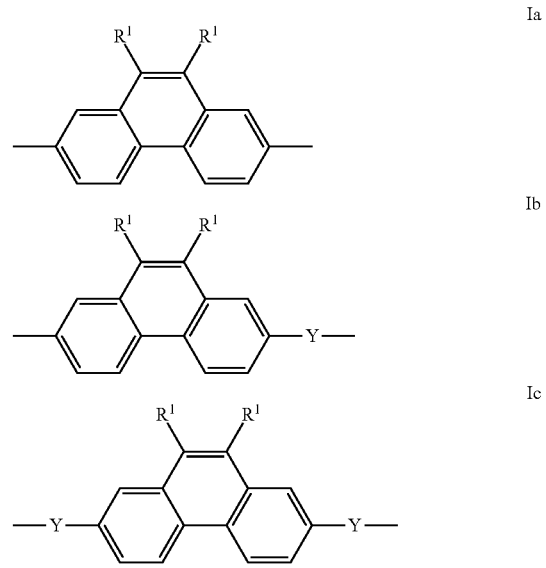

wherein $R^1$ and Y are as defined in formula I.

Preferably the units of formula I contain one or more substituents $R^1$ different from H, to improve solubility of the polymers. If further units are present, these are also preferably substituted by one or more groups $R^1$ to contribute to the solubility.

Preferably the substituents $R^1$ contain at least 2, very preferably at least 4, most preferably at least 6 non-aromatic C atoms, to improve solubility of the polymers. However, it is also possible that a certain proportion of recurring units does not carry any further non-aromatic substituents. Further preferred are substituents $R^1$ containing not more than 12, very preferably not more than 8, most preferably not more than 6 C atoms in a linear chain, to improve film morphology of the coated polymer film. Non-aromatic C atoms are for example present in corresponding straight-chain, branched or cyclic alkyl or alkoxy chains.

Especially preferably $R^1$ is straight-chain, branched or cyclic alkyl having 2 to 15, very preferably 4 to 8 C atoms, in which one or more non-adjacent C atoms are optionally replaced by O, S, CO, O—CO, CO—O, O—CO—O, CH=CH or C≡C, most preferably by O, CH=CH or C≡C, wherein preferably heteroatoms are not bonded directly to the phenanthrene unit, and in which one or more H atoms are optionally replaced by F or CN, or aryl or heteroaryl having 4 to 20, most preferably 5 to 10 C atoms, which is optionally substituted by one or more non-aromatic radicals R, or a combination of a plurality of these systems.

The two radicals R¹ may together also form a further mono- or polycyclic, aliphatic ring system.
Especially preferred are units of formula I which are symmetrically substituted in the 9,10-positions of the phenanthrene units.
Especially preferred units of formula Ia are those selected from the following subformulae:
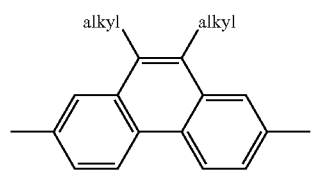
Ia1
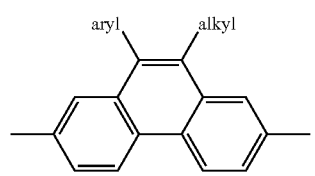
Ia2
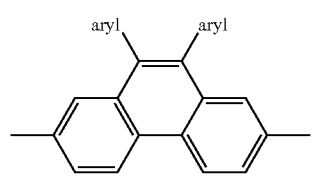
Ia3
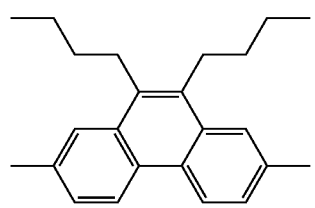
Ia4
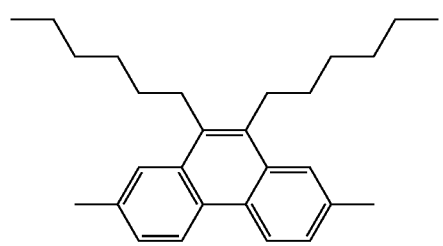
Ia5
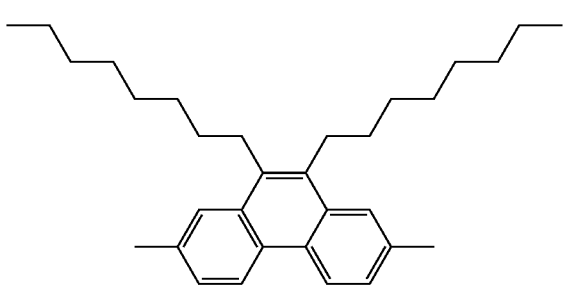
Ia6
-continued
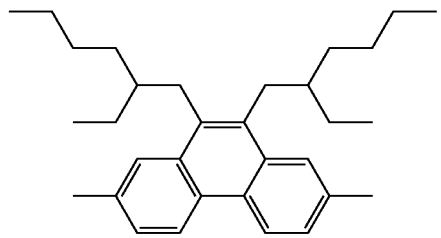
Ia7
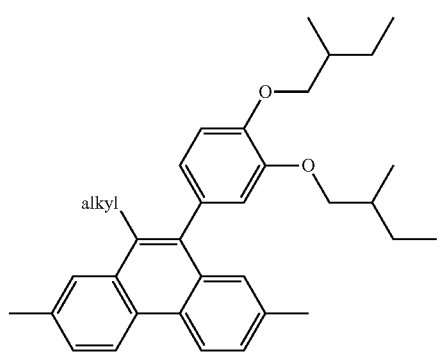
Ia9
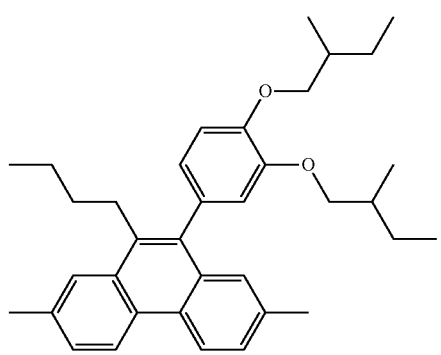
Ia10
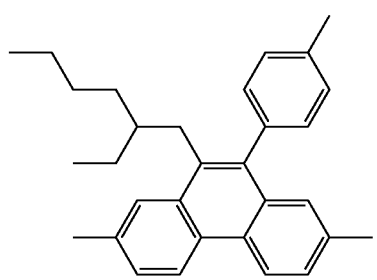
Ia11
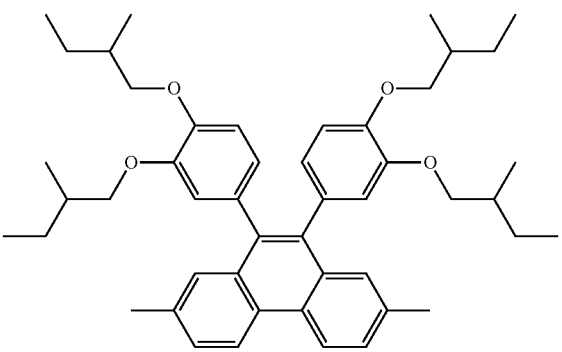
Ia12

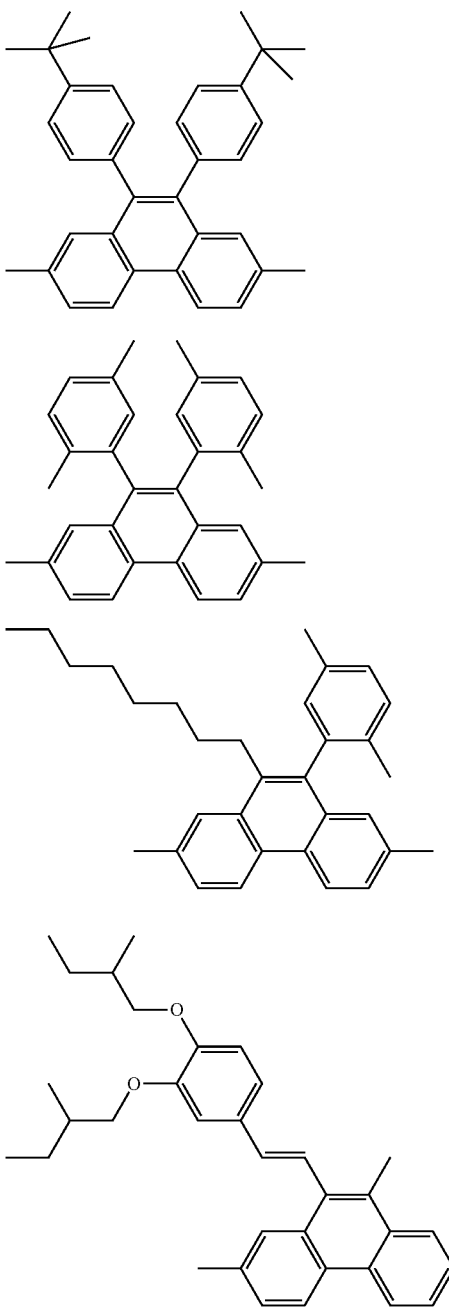

Ia13

Ia14

Ia15

Ia16 wherein the units are linked to adjacent units in the polymer via the 2,7-positions of the phenanthrene units, as indicated by the terminal bonds, possible substituents on $R^1$ groups are not shown for better clarity, "alkyl" means an aliphatic alkyl group, and "aryl" means an aryl or heteroaryl group as described for $R^1$.

Preferably the units of formula II contain one or more substitutents $R^2$ and/or $R^3$ different from H, to improve solubility of the polymers. If further units are present, these are also preferably substituted by one or more groups $R^1$ to contribute to the solubility.

Preferably the substituents $R^2$ and/or $R^3$ contain at least 2, very preferably at least 4, most preferably at least 6 non-aromatic C atoms, to improve solubility of the polymers. However, it is also possible that a certain proportion of recurring units does not carry any further non-aromatic substituents. Further preferred are substituents $R^2$ and $R^3$ containing not more than 12, very preferably not more than 8, most preferably not more than 6 C atoms in a linear chain, to improve film morphology of the coated polymer film. Non-aromatic C atoms are for example present in corresponding straight-chain, branched or cyclic alkyl or alkoxy chains. Further preferred are substitutents $R^2$ and $R^3$ that denote an aromatic or heteroaromatic group with preferably 5 to 8 ring atoms, for example a phenyl group, which is unsubstituted or substituted with one or more non-aromatic groups R. Non-aromatic groups are for example straight-chain, branched or cyclic alkyl or alkoxy chains.

Especially preferably $R^2$ and/or $R^3$ denote straight-chain, branched or cyclic alkyl having 2 to 15, very preferably 4 to 8 C atoms, in which one or more non-adjacent C atoms are optionally replaced by O, S, CO, O—CO, CO—O, O—CO—O, CH=CH or C≡C, most preferably by O, CH=CH or C≡C, wherein preferably heteroatoms are not bonded directly to the indenofluorene unit, and in which one or more H atoms are optionally replaced by F or CN, or aryl or heteroaryl having 4 to 20, most preferably 5 to 10 C atoms, which is optionally substituted by one or more non-aromatic radicals R, or a combination of a plurality of these systems.

The two radicals $R^2$ or $R^3$ may together also form a further mono- or polycyclic, aliphatic ring system.

Especially preferred units of formula II are those selected from the following subformulae:

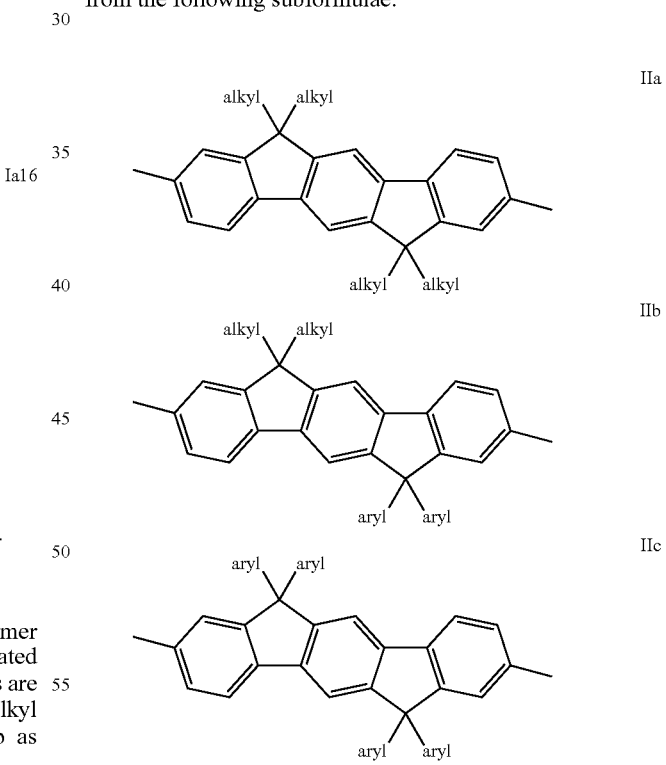

IIa

IIb

IIc wherein the units are linked to adjacent units in the polymer via the 2,8-positions of the indenofluorene units, as indicated by the terminal bonds, possible substituents on $R^{2,3}$ groups are not shown for better clarity, "alkyl" means an aliphatic alkyl group, and "aryl" means an aryl or heteroaryl group as described for $R^2$.

Especially preferred units of formula IIb are those selected from the following subformulae:

IIb1

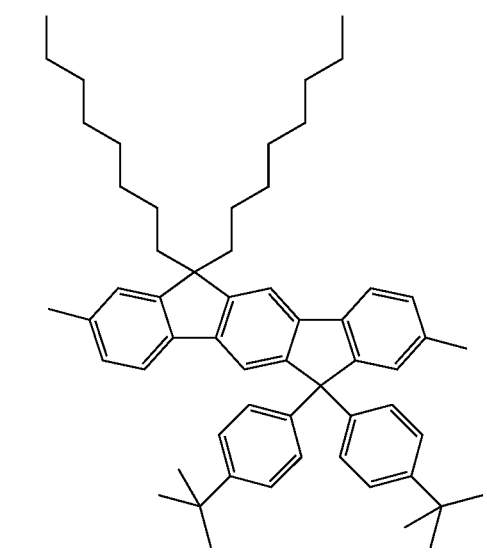

IIb2 wherein the units are linked to adjacent units in the polymer via the 2,8-positions of the indenofluorene units, as indicated by the terminal bonds, and possible substituents on $R^{2,3}$ groups are not shown for better clarity.

Further preferred are copolymers comprising, in addition to the units of formula I and/or II, one or more further units which are preferably selected from the group consisting of the following formulae:

4

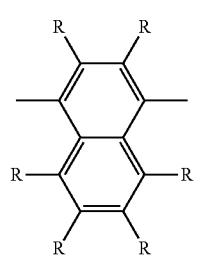

5

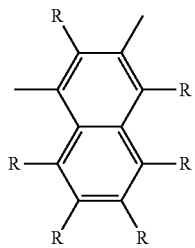

6

7

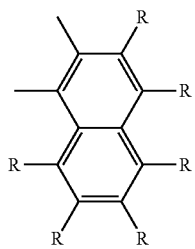

8

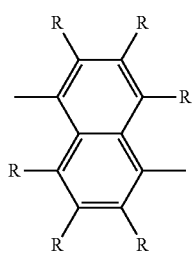

9

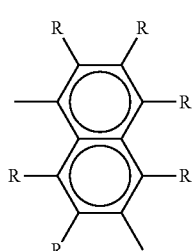

10

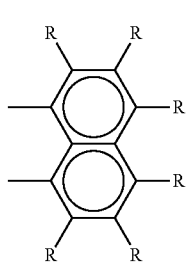

11
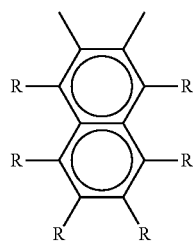
12
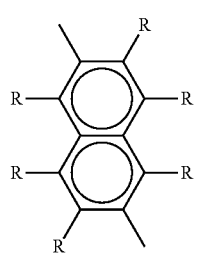
13
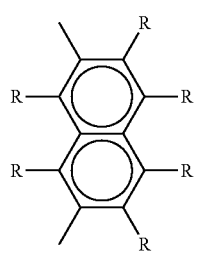
14
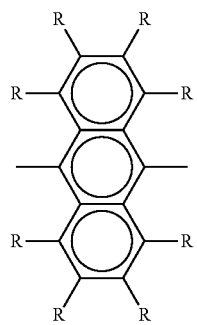
15
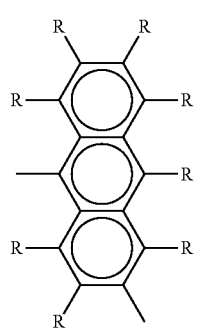
16
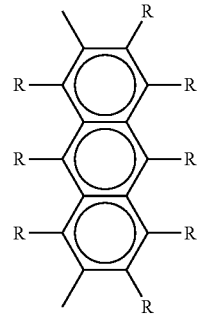
17
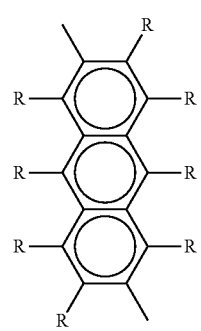
18
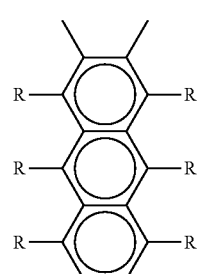
19
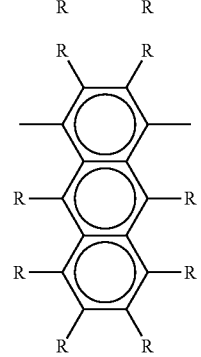
20
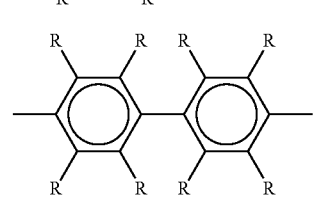
21
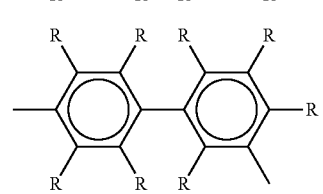

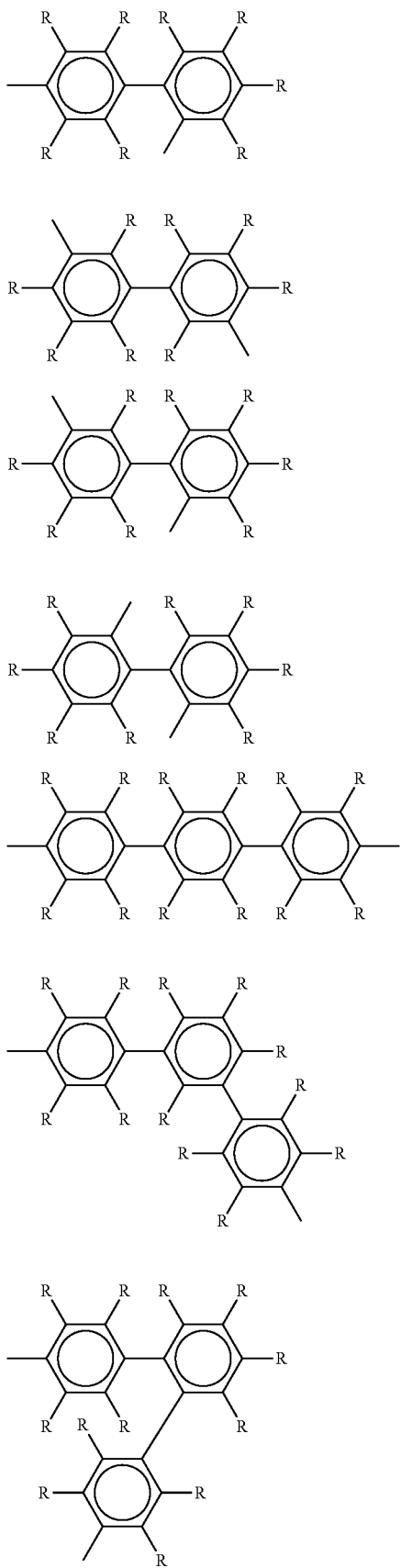
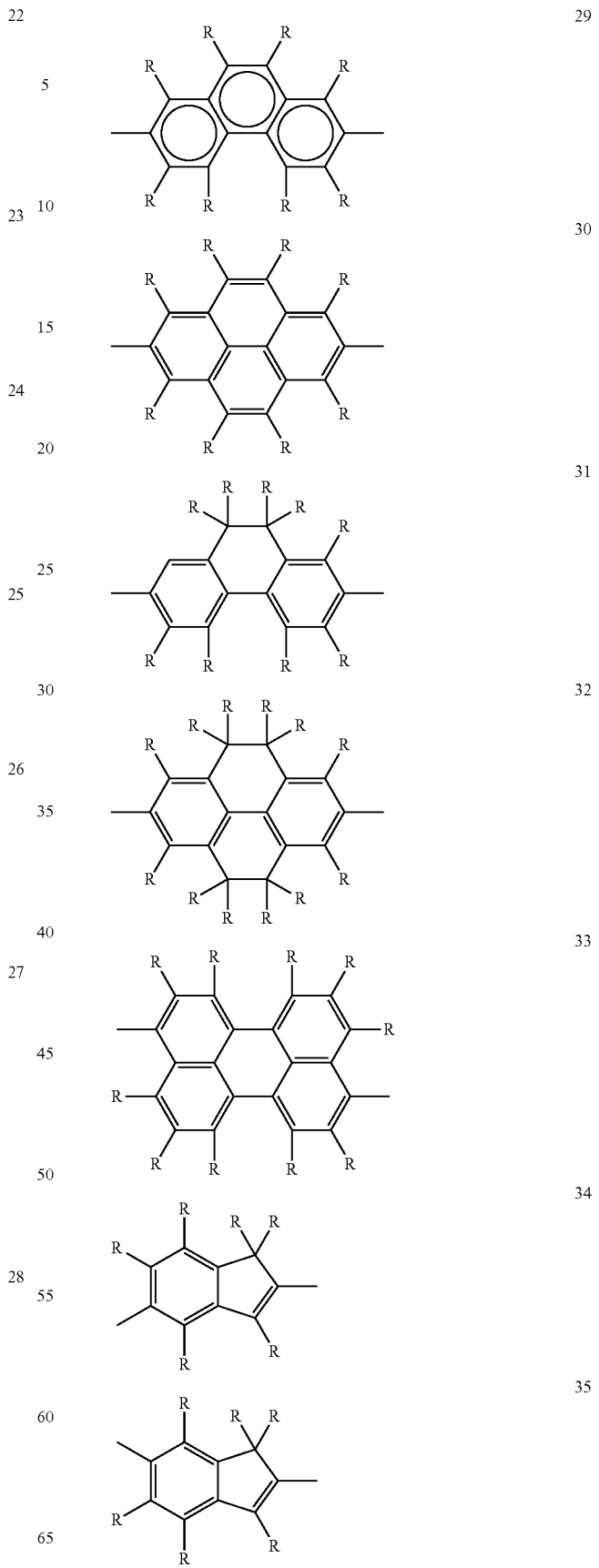

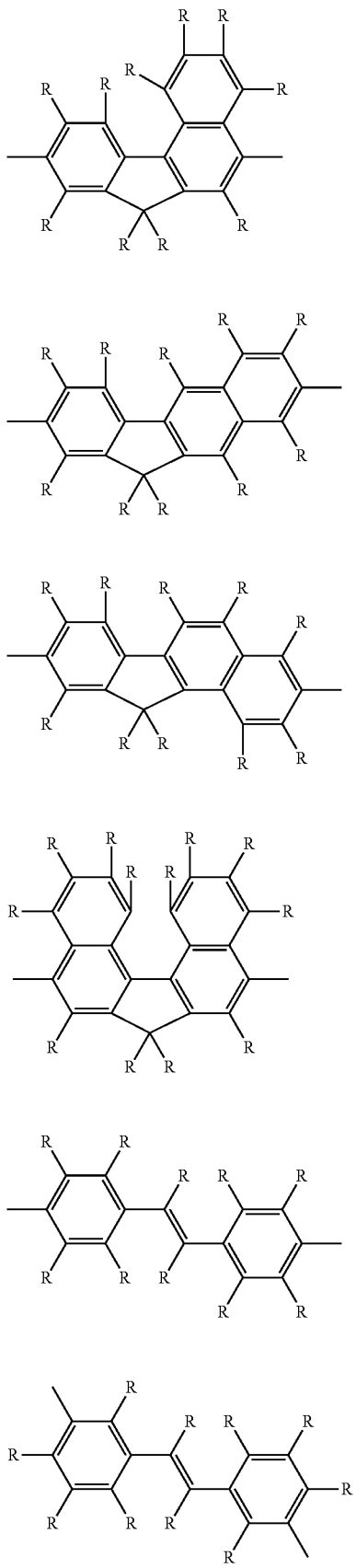

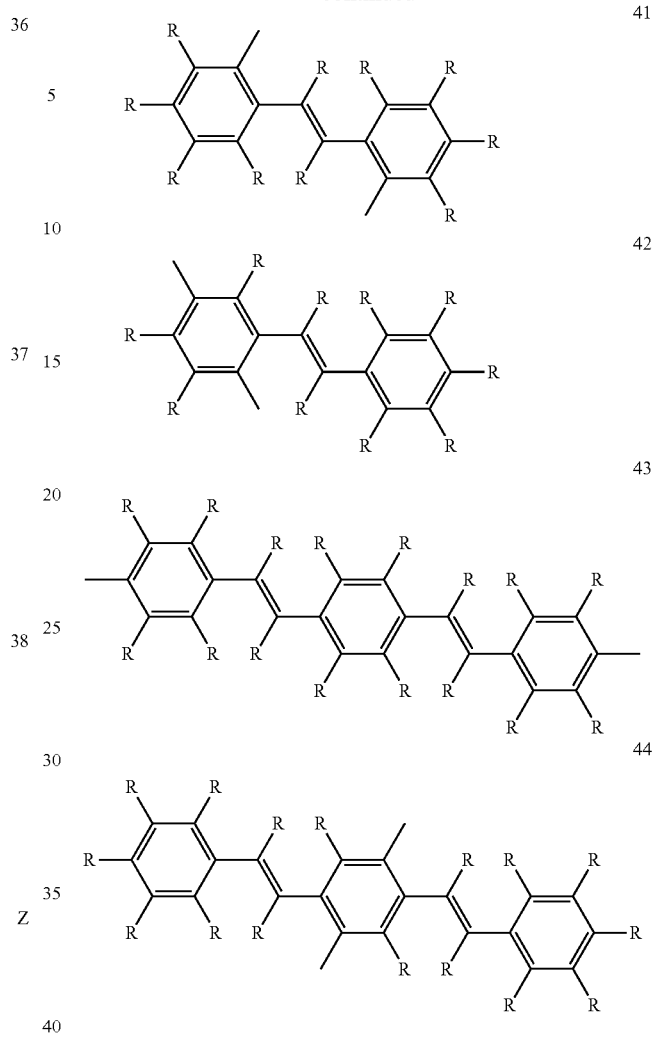

wherein the the terminal bonds indicate a linkage to an adjacent unit in the polymer, and wherein R, on each occurrence identically or differently, has one of the meanings given in formula I.

The conjugated polymers are preferably selected of formula III

-[A]$_x$-[B]$_y$-  III wherein A is a unit of formula I or II, B is a unit of formula I or II, or of their preferred subformulae, which is different from unit A, and x and y denote the molar ratio of the units A and B, respectively, in the polymer, with 0<x<1 and 0<y<1 and x+y=1.

Especially preferred are polymers of formula IIIa

-[A-B]$_n$-  IIIa wherein A and B are as defined in formula III and n is an integer >1.

Further preferred are polymers of formula IIIb

R$^5$-[A-B]$_n$—R$^6$  IIIb wherein n, A and B are as defined in formula IIIa and R$^5$ and R$^6$ have independently of each other one of the meanings of R given in formula I.

In the polymers according to the the present invention the total number of repeating units, or n, is preferably ≧10, very preferably ≧50, and preferably ≦2,000, very preferably ≦1,000.

The polymers of the present invention include homopolymers and copolymers, like statistical or random copolymers, alternating copolymers and block copolymers, as well as combinations thereof.

The polymers of the present invention can be synthesized according to or in analogy to methods that are known to the skilled person and are described in the literature. Other methods of preparation can be taken from the examples. For example, they can be suitably prepared by aryl-aryl coupling reactions, such as Yamamoto coupling, Suzuki coupling, Stille coupling, Sonogashira coupling, Heck coupling or Buchwald coupling, all of which are well-known to the skilled person and are described in the literature. Suzuki coupling and Yamamoto coupling are especially preferred.

The monomers which are polymerised to form the repeat units of the polymers can be prepared according to methods which are known to the person skilled in the art.

Another aspect of the invention is a process for preparing a polymer by coupling one or more identical or different monomers based on a unit of formula I with each other in a polymerisation reaction.

Another aspect of the invention is a process for preparing a copolymer by coupling one or more identical or different monomers based on units of formula I with each other and with one or more identical or different monomers based on units of formula II in a polymerisation reaction.

Preferred methods for polymerisation are those leading to C—C-coupling or C—N-coupling, like Suzuki polymerisation, as described for example in WO 00/53656 A1, Yamamoto polymerisation, as described in for example in T. Yamamoto et al., Progress in Polymer Science 1993, 17, 1153-1205 or in WO 2004/022626 A1, and Stille coupling.

The monomers based on the units of formula I are for example selected of formula IV

   IV wherein A is a unit of formula I or its preferred subformulae shown above, and $R^7$ and $R^8$ denote independently of each other halogen, —CH$_2$Cl, —CHO, —CH=CH$_2$, —SiR'R"R''', —SnR'R"R''', —BR'R", —B(OR')(OR"), —B(OH)$_2$, or a leaving group, wherein and R', R" and R''' have independently of each other one of the meanings of $R^0$ given above or denote halogen, and R' and R" may also form a ring together with the hetero atom to which the are attached.

The monomers based on the units of formula II are for example selected of formula IV above, or of formula V

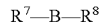   V wherein B is a unit of formula II or its preferred subformulae shown above and $R^{7,8}$ are as defined in formula IV.

Suitable and preferred leaving groups in formula IV and V are those of formula —O—SO$_2$Z, wherein Z is optionally substituted alkyl or aryl or a combination thereof, preferably fluorinated alkyl with 1 to 12 C atoms, or aryl or alkylaryl with 6 to 12 C atoms. Particularly preferred examples of such leaving groups are O-tosylate, O-mesylate, O-triflate and O-nonaflate.

For example, when synthesizing a linear polymer by Yamamoto polymerisation, monomers as described above having two reactive halide groups $R^{7,8}$ is preferably used. When synthesizing a linear polymer by Suzuki polymerisation, preferably a monomer as described above is used wherein at least one reactive group $R^{7,8}$ is a boronic acid or boronic acid derivative group.

Suzuki polymerisation may be used to prepare homopolymers as well as statistical, alternating and block random copolymers. Statistical or block copolymers can be prepared for example from the above monomers of formula IV and/or V wherein one of the reactive groups $R^7$ and $R^8$ is halogen and the other reactive group is a boronic acid or boronic acid derivative group.

Alternating copolymers can be prepared for example from monomers of formula IV wherein $R^7$ and $R^8$ denote a boronic acid or boronic acid derivative group and monomers of formula V wherein $R^7$ and $R^8$ denote a halide group.

The synthesis of statistical, alternating and block copolymers is described in detail for example in WO 03/048225 A2 or WO 2005/014688 A2.

Suzuki polymerisation employs a Pd(0) complex or a Pd(II) salt. Preferred Pd(0) complexes are those bearing at least one phosphine ligand such as Pd(Ph$_3$P)$_4$. Another preferred phosphine ligand is tris(ortho-tolyl)phosphine, i.e. Pd(o-Tol)$_4$. Preferred Pd(II) salts include palladium acetate, i.e. Pd(OAc)$_2$. Suzuki polymerisation is performed in the presence of a base, for example sodium carbonate, potassium phosphate or an organic base such as tetraethylammonium carbonate. Yamamoto polymerisation employs a Ni(0) complex, for example bis(1,5-cyclooctadienyl) nickel(0).

Monomers or formula IV and their synthesis are described for example in WO 2005/104264 A1 or the references cited therein. Monomers or formula V and their synthesis are described for example in WO 2004/041901 A1 or the references cited therein.

The novel methods of preparing monomers and polymers as described above and below are another aspect of the invention.

The polymers according to the present invention are useful as charge transport, semiconducting, electrically conducting, photoconducting or light mitting materials in optical, electrooptical, electronic, electroluminescent or photoluminescent components or devices.

Especially preferred devices are OFETs, TFTs, ICs, logic circuits, capacitors, RFID tags, OLEDs, OLETs, OPVs, solar cells, laser diodes, photoconductors, photodetectors, electrophotographic devices, electrophotographic recording devices, organic memory devices, sensor devices, charge injection layers, Schottky diodes, planarising layers, antistatic films, conducting substrates and conducting patterns. In these devices, the polymers of the present invention are typically applied as thin layers or films.

OFETs where an organic semiconducting (OSC) material is arranged as a thin film between a gate dielectric and a drain and a source electrode, are generally known, and are described for example in U.S. Pat. No. 5,892,244, WO 00/79617, U.S. Pat. No. 5,998,804, and in the references cited in the background section. Due to the advantages, like low cost production using the solubility properties of the polymers according to the invention and thus the processibility of large surfaces, preferred applications of these FETs are such as integrated circuitry, TFT displays and security applications.

The polymers according to the present invention can also be used in polymer blends, for example together with other polymers having charge-transport, semiconducting, electrically conducting, photoconducting and/or light emitting semiconducting properties, or for example with polymers having hole blocking or electron blocking properties for use as interlayers or charge blocking layers in OLED devices. Thus, another aspect of the invention relates to a polymer blend comprising one or more polymers according to the present invention and one or more further polymers having one or more of the above-mentioned properties. These blends can be prepared by conventional methods that are described in prior art and known to the skilled person. Typically the polymers are mixed with each other or dissolved in suitable solvents and the solutions combined.

Another aspect of the invention relates to a formulation comprising one or more polymers or polymer blends as described above and below and one or more organic solvents.

Examples of suitable and preferred organic solvents include, without limitation, dichloromethane, trichloromethane, monochlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetraline, decaline, indane, methyl benzoate, ethyl benzoate, mesitylene and/or mixtures thereof.

The concentration of the polymers in the solution is preferably 0.1 to 10% by weight, more preferably 0.5 to 5% by weight. Optionally, the solution also comprises one or more binders to adjust the rheological properties, as described for example in WO 2005/055248 A1.

After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., Journal of Paint Technology, 38, No 496, 296 (1966)". Solvent blends may also be used and can be identified as described in "Solvents, W. H. Ellis, Federation of Societies for Coatings Technology, p 9-10, 1986". Such a procedure may lead to a blend of 'non' solvents that will dissolve both the polymers of the present invention, although it is desirable to have at least one true solvent in a blend.

The polymers according to the present invention can also be used in patterned OSC layers in the devices as described above and below. For applications in modern microelectronics it is generally desirable to generate small structures or patterns to reduce cost (more devices/unit area), and power consumption. Patterning of thin layers comprising a polymer according to the present invention can be carried out for example by photolithography, electron beam lithography or laser patterning.

For use as thin layers in electronic or electrooptical devices the polymers, polymer blends or formulations of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing. Ink-jet printing is particularly preferred as it allows high resolution layers and devices to be prepared.

Selected formulations of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the polymers should be first dissolved in a suitable solvent. Solvents must fulfil the requirements stated above and must not have any detrimental effect on the chosen print head. Additionally, solvents should have boiling points >100° C., preferably >140° C. and more preferably >150° C. in order to prevent operability problems caused by the solution drying out inside the print head. Apart from the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing a polymer according to the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the polymer, which reduces or prevents clogging of the jets and separation of the components during spraying. The solvent(s) may include those selected from the following list of examples: dodecylbenzene, 1-methyl-4-tert-butylbenzene, terpineol limonene, isodurene, terpinolene, cymene, diethylbenzene. The solvent may be a solvent mixture, that is a combination of two or more solvents, each solvent preferably having a boiling point >100° C., more preferably >140° C. Such solvent(s) also enhance film formation in the layer deposited and reduce defects in the layer.

The ink jet fluid (that is mixture of solvent, binder and semiconducting compound) preferably has a viscosity at 20° C. of 1-100 mPa·s, more preferably 1-50 mPa·s and most preferably 1-30 mPa·s.

The polymers or formulations according to the present invention can additionally comprise one or more further components like for example surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors. The surface active compounds do optionally act as a Self Assembled Monolayer (SAM) layer to enhance the injection into the electrodes (SAM coated source drain electrodes) or to enhance the microstructure of the semiconductor at the semiconductor/dielectric interface or/and to shield the semiconductor from charge transport disrupting surface dipoles (high K surface).

An OFET device according to the present invention preferably comprises:
  a source electrode,
  a drain electrode,
  a gate electrode,
  an organic semiconducting (OSC) layer,
  one or more gate insulator layers,
  optionally a substrate,
  wherein the OSC layer comprises one or more polymers according to the present invention.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer. The OFET device can be a top gate device or a bottom gate device. Suitable structures and manufacturing methods of an OFET device are known to the skilled in the art and are described in the literature, for example in WO 03/052841.

An OPV device according to the present invention preferably comprises:
- a low work function electrode (for example Aluminum),
- a high work function electrode (for example ITO), one of which is transparent,
- a bilayer of consisting of a hole transporting and an electron transporting material; the bilayer can exist as two distinct layers, or as a blended mixture, a so-called bulk heterojunction (BHJ) (see for example Coakley, K. M. and McGehee, M. D. *Chem. Mater.* 2004, 16, 4533),
- an optional conducting polymer layer (such as for example PEDOT:PSS) to modify the work function of the high work function electrode to provide an ohmic contact for the hole,
- an optional coating on the high workfunction electrode (such as LiF) to provide an ohmic contact for electrons.

The hole transporting polymer in the blend exists of one of the polymers of the present invention. The electron transporting material can be an inorganic material such as zinc oxide or cadmium selenide, or an organic material such as a fullerene derivate, for example PCBM, [(6,6)-phenyl C61-butyric acid methyl ester] or a polymer, see for example Coakley, K. M. and McGehee, M. D. *Chem. Mater.* 2004, 16, 4533. For the blended mixture, an optional annealing step may be necessary to optimize blend morphology and consequently OPV device performance.

In security applications, OFETs and other devices with semiconducting materials according to the present invention, like transistors or diodes, can be used for RFID tags or security markings to authenticate and prevent counterfeiting of documents of value like banknotes, credit cards or ID cards, national ID documents, licenses or any product with monetary value, like stamps, tickets, shares, cheques etc.

Alternatively, the materials according to the invention can be used in organic light emitting devices or diodes (OLEDs), e.g., in display applications or as backlight of e.g. liquid crystal displays. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The inventive compounds, materials and films may be employed in one or more of the charge transport layers and/or in the emission layer, corresponding to their electrical and/or optical properties. Furthermore their use within the emission layer is especially advantageous, if the compounds, materials and films according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Meerholz, Synthetic Materials, 111-112, 2000, 31-34, Alcala, J. Appl. Phys., 88, 2000, 7124-7128 and the literature cited therein.

According to another use, the materials according to the present invention, especially those which show photoluminescent properties, may be employed as materials of light sources, e.g., of display devices such as described in EP 0 889 350 A1 or by C. Weder et al., Science, 279, 1998, 835-837.

A further aspect of the invention relates to both the oxidised and reduced form of the polymers according to this invention. Either loss or gain of electrons results in formation of a highly delocalised ionic form, which is of high conductivity. This can occur on exposure to common dopants. Suitable dopants and methods of doping are known to those skilled in the art, e.g. from EP 0 528 662, U.S. Pat. No. 5,198,153 or WO 96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantantion of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, $(NO_2^+)$ $(SbF_6^-)$, $(NO_2^+)$ $(SbCl_6^-)$, $(NO_2^+)$ $(BF_4^-)$, $AgClO_4$, $H_2IrCl_6$, La$(NO_3)_3 \cdot 6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of the polymers of the present invention can be used as an organic "metal" in applications including, but not limited to, charge injection layers and ITO planarising layers in OLED applications, films for flat panel displays and touch screens, antistatic films, printed conductive substrates, patterns or tracts in electronic applications such as printed circuit boards and condensers.

According to another use, the materials according to the present invention can be used alone or together with other materials in or as alignment layers in LCD or OLED devices, as described for example in US 2003/0021913. The use of charge transport compounds according to the present invention can increase the electrical conductivity of the alignment layer. When used in an LCD, this increased electrical conductivity can reduce adverse residual dc effects in the switchable LCD cell and suppress image sticking or, for example in ferroelectric LCDs, reduce the residual charge produced by the switching of the spontaneous polarisation charge of the ferroelectric LCs. When used in an OLED device comprising a light emitting material provided onto the alignment layer, this increased electrical conductivity can enhance the electroluminescence of the light emitting material. The compounds or materials according to the present invention having mesogenic or liquid crystalline properties can form oriented anisotropic films as described above, which are especially useful as alignment layers to induce or enhance alignment in a liquid crystal medium provided onto said anisotropic film. The materials according to the present invention may also be combined with photoisomerisable compounds and/or chromophores for use in or as photoalignment layers, as described in US 2003/0021913.

According to another use the materials according to the present invention, especially their water-soluble derivatives (for example with polar or ionic side groups) or ionically doped forms, can be employed as chemical sensors or materials for detecting and discriminating DNA sequences. Such uses are described for example in L. Chen, D. W. McBranch, H. Wang, R. Helgeson, F. Wudl and D. G. Whitten, Proc. Natl. Acad. Sci. U.S.A. 1999, 96, 12287; D. Wang, X. Gong, P. S. Heeger, F. Rininsland, G. C. Bazan and A. J. Heeger, Proc. Natl. Acad. Sci. U.S.A. 2002, 99, 49; N. DiCesare, M. R. Pinot, K. S. Schanze and J. R. Lakowicz, Langmuir 2002, 18, 7785; D. T. McQuade, A. E. Pullen, T. M. Swager, Chem. Rev. 2000, 100, 2537.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

The invention will now be described in more detail by reference to the following examples, which are illustrative only and do not limit the scope of the invention.

Example 1

Conjugated alternating copolymer P1 is prepared from monomers (1) and (2) as shown below by the procedure as described in the following, which is also disclosed in WO03/048225.

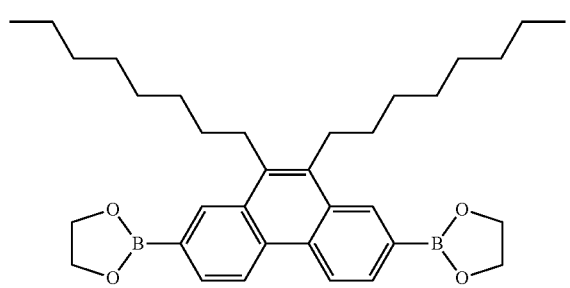

(1)

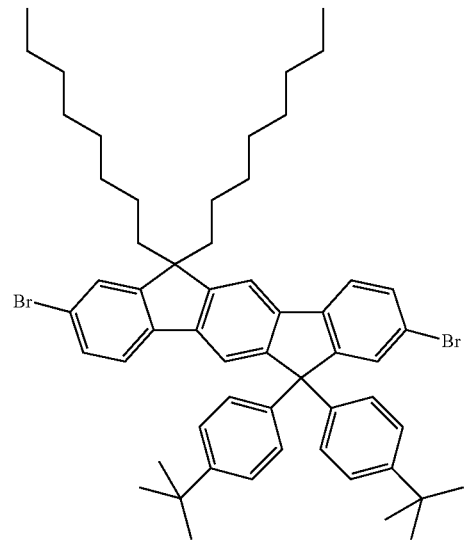

(2)

The synthesis of monomer (1) is described in WO 2005/104264 A1. The synthesis of monomer (2) is described in WO 2004/041901 A1.

A solution of Dioxane/toluene is mixed with 0.1 mol % Pd.

Copolymerisation is carried out with 50 mol % of the Bisboron acid ester (monomer 1) and 50 mol % of the Bisbromide (monomer 2) as follows:

4.003 g (5 mmol) of monomer (1), 4.094 g (5 mmol) of monomer (2) and 5.066 g (22 mmol) $K_3PO_4 \cdot H_2O$, is dissolved in 50 ml of dioxane, 50 ml toluene and 50 ml $H_2O$. The resulting solution is degassed using Ar or $N_2$.

The solution is heated under inert atmosphare to 87° C. and the reaction is started by adding 2.2 mg (10 μmol) Palladiumacetate and 9.1 mg (60 μmol) Tris-o-tolylphosphine desolved in 1 ml dioxane/toluene. The reaction mixture is refluxed for about 1 hour until the target viscosity is reached. To stop the reaction 0.3 ml bromobenzene is added and the reaction mixture is kept at reflux temperature for additional hour. The solution is cooled to 65° C., and diluted with 200 ml toluene and 100 ml of 10% thiocarbamide-solution and stirred at 65° C. for 3 hours. The reaction mixture will cooled to r.t. and extracted 3 times with water and then precipitated in twice as much methanol then filtered. For purification the polymer is dissolved in toluene followed by precipitation in the double amount of methanol. This procedure is then repeated.

Example 2

Conjugated alternating copolymer P2 is prepared from monomers (3) and (4) as shown below (each 50 mol %) in analogy to the method described in Example 1.

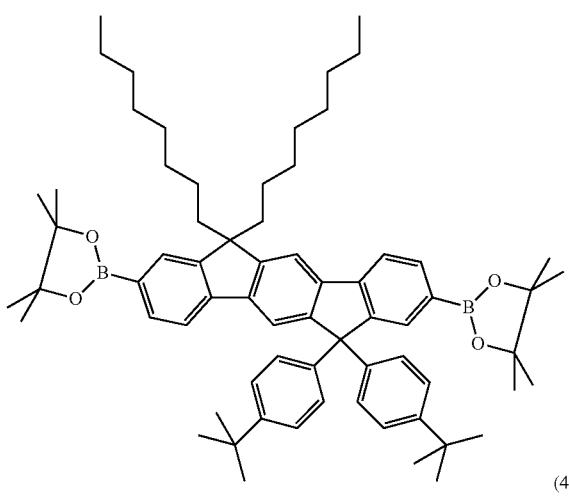
(3)

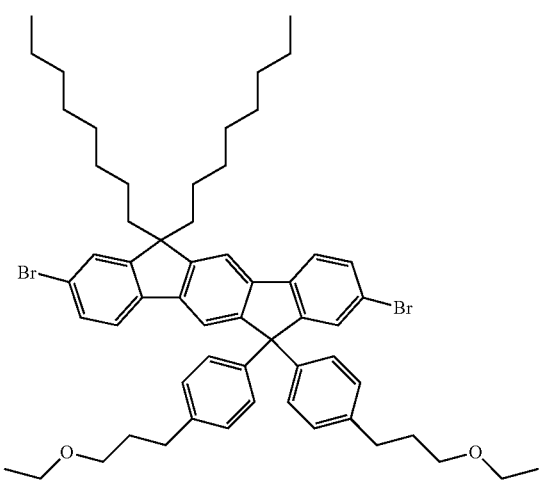
(4)

Monomers (3) and (4) can be prepared as described in WO 2005/104264 A1 or in analogy thereto.

Example 3

Conjugated alternating copolymer P3 is prepared from monomer (3) of Example 2 and monomer (5) as shown below (each 50 mol %) in analogy to the method described in Example 1.

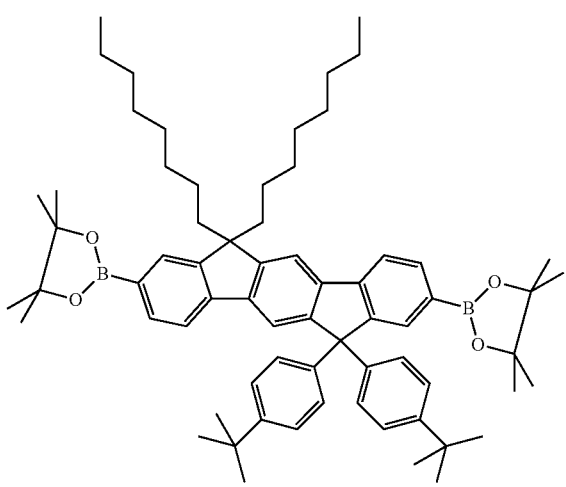
(3)

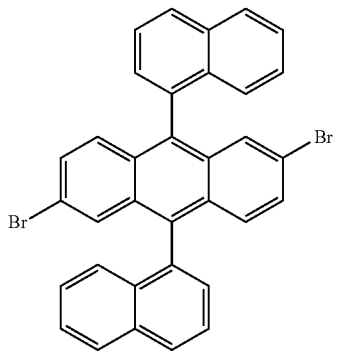
(5)

Comparison Example 1

Conjugated polymer C1 is prepared from monomers (1) and (2) of Example 1 and monomer (6) as shown below by the procedure as described in the following.

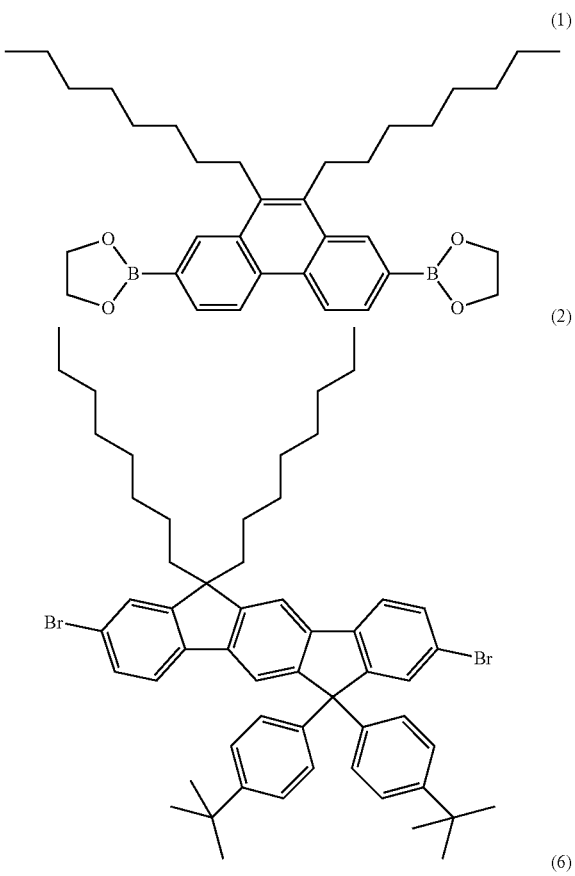

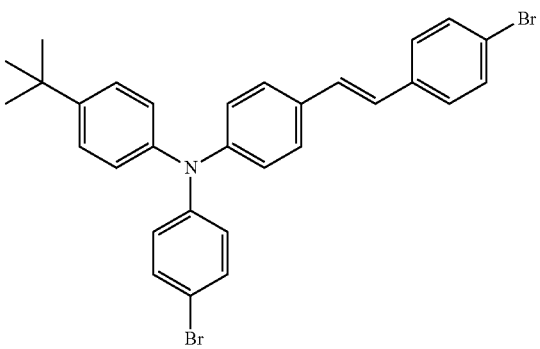
(6)

1.627 g (3 mmol) of monomer (1), 1.892 g (2.1 mmol) of monomer (2), 0.505 g (0.9 mmol) of monomer (6) and 3.044 g (13.2 mmol) $K_3PO_4*H_2O$, is dissolved in 30 ml of dioxane, 30 ml toluene and 30 ml $H_2O$. The resulting solution is degassed using Ar. The solution is heated under inert atmosphare to 87° C. and the reaction is started by adding 1.35 mg (6 µmol) Palladium acetate and 11 mg (36 µmol) Tris-o-tolylphosphine dissolved in 1 ml dioxane/toluene. The reaction mixture is refluxed for about 1 hour until the target viscosity is reached. To stop the reaction 0.3 ml bromobenzene is added and the reaction mixture is kept at reflux temperature for additional hour. The solution is cooled to 65° C., and diluted with 100 ml toluene and 100 ml of 10% thiocarbamide-solution then stirred at 65° C. for 3 hours. The reaction mixture is cooled to r.t. and extracted 3 times with water, precipitated in twice as much methanol then filtered. For purification the polymer is dissolved in toluene followed by precipitation in the double amount of methanol. This procedure is then repeated.

Comparison Example 2

Conjugated polymer C2 is prepared from monomers (1) and (2) of Example 1 and monomer (7) as shown below by the procedure as described in the following.

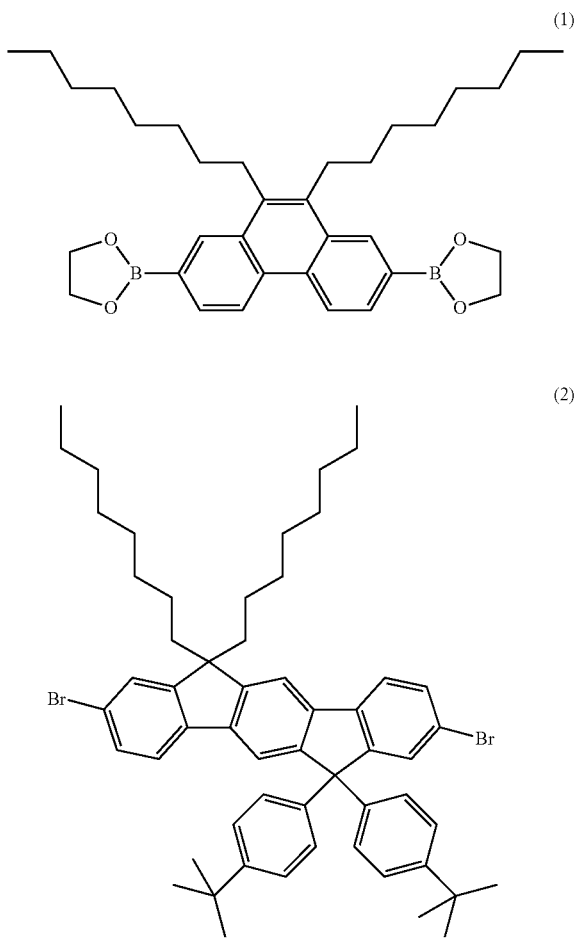

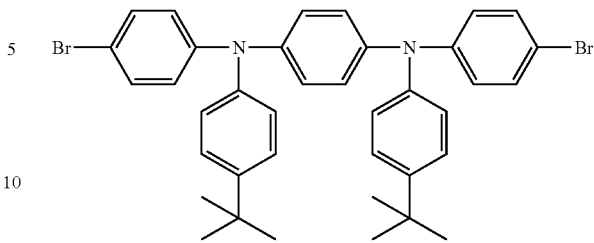

1.087 g (2 mmol) of monomer (1), 1.784 g (1.98 mmol) of monomer (2), 0.013 g (0.02 mmol) of monomer (7) and 2.027 g (8.8 mmol) $K_3PO_4*H_2O$, is dissolved in 20 ml of dioxane, 20 ml toluene and 20 ml $H_2O$. The resulting solution is degassed using Ar. The solution is heated under inert atmosphare to 87° C. and the reaction is started by adding 0.898 mg (4 µmol) Palladium acetate and 7.3 mg (24 µmol) Tris-o-tolylphosphine desolved in 1 ml dioxane/toluene. The reaction mixture is refluxed for about 1 hour until the target viscosity is reached. To stop the reaction 0.3 ml bromobenzene is added and the reaction mixture is kept at reflux temperature for additional hour. The solution is cooled to 65° C., and diluted with 80 ml toluene and 80 ml of 10% thiocarbamide-solution and stirred at 65° C. for 3 hours. The reaction mixture is cooled to r.t. and extracted 3 times with water and then precipitated in twice as much methanol then filtered. For purification the polymer is dissolved in toluene followed by precipitation in the double amount of methanol. This procedure is then repeated.

Comparison Example 3

Conjugated polymer C3 is prepared from monomer (2) of Example 1 and monomer (8) as shown below (each 50 mol %) by the procedure as described in Comparison Example 1.

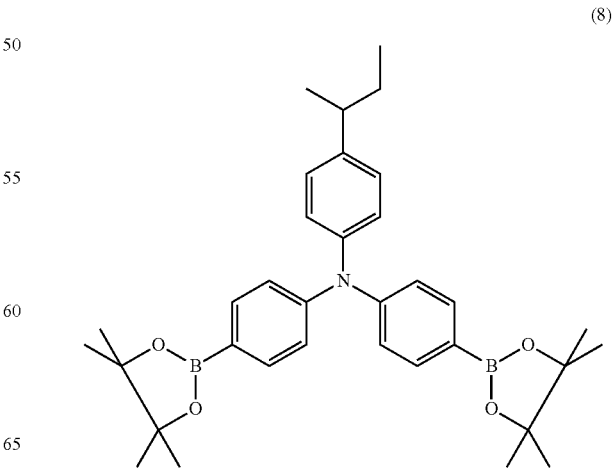

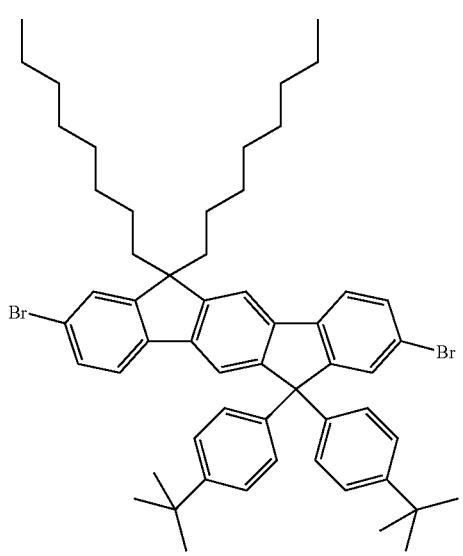

Comparison Example 4

Conjugated polymer C4 is prepared from monomer (3) of Example 2 and monomer (9) as shown below (each 50 mol %) by the procedure as described in Comparison Example 1.

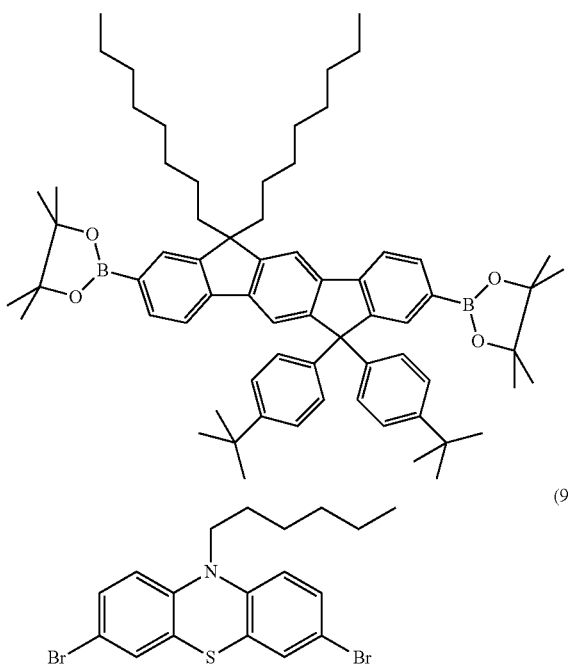

Comparison Example 5

Conjugated polymer C5 is prepared from monomers (10) and (11) as shown below (each 50 mol %) by a Buchwald coupling reaction as described in the following.

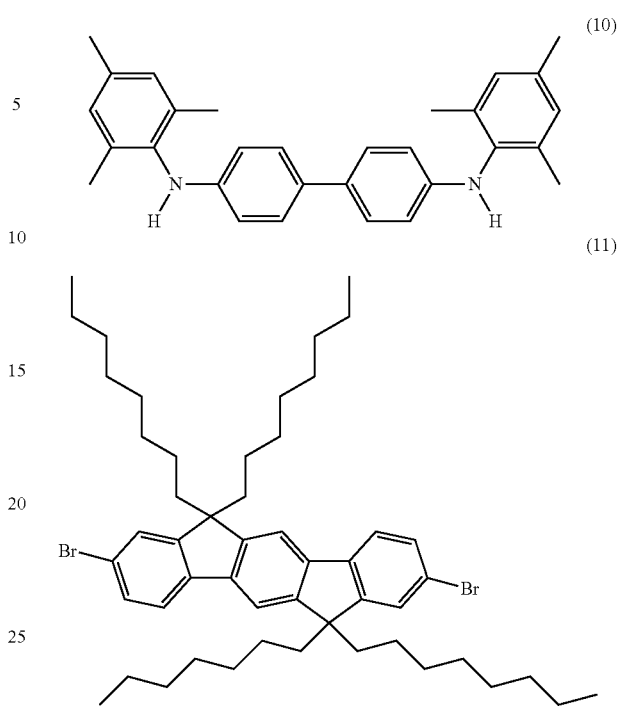

0.841 g (2 mmol) of monomer (10), 1.721 g (2 mmol) of monomer (11), and 0.577 g (6 mmol) Sodium-tert.-butylate, is dissolved in 20 ml of toluene. The resulting solution is degassed using Ar. The solution is heated under inert atmosphare to 87° C. and the reaction is started by adding 3.6 mg (16 µmol) Palladium acetate and 69 mg (96 µmol) Tri-tert. butylphosphine desolved in 1 ml toluene. The reaction mixture is refluxed for about 1 hour until the target viscosity is reached. To stop the reaction 0.3 ml bromobenzene is added and the reaction mixture is kept at reflux temperature for additional hour. The solution is cooled to 65° C., and diluted with 80 ml toluene and 80 ml of 10% thiocarbamide-solution and stirred at 65° C. for 3 hours. The reaction mixture is cooled to r.t. and extracted 3 times with water and then precipitated in twice as much methanol then filtered. For purification the polymer is dissolved in toluene followed by precipitation in the double amount of methanol. This procedure is then repeated.

Use Examples 1-8

A top gate transistor device is prepared as follows:
High quality transistor grade glass is cleaned in 3% decon at 70 C for 30 min. The transistor grade is specifically designed to be low in ionic impurities and have a surface that is as smooth as possible. The glass is then rinsed in water with at least 5 changes of water to make sure no detergent remains on the surface. The substrate is then dried with an air gun. To this clean surface silver source drain electrodes are thermally evaporated to approx. 30 nm through a shadow mask which has 10, 20, 50 um gaps for corresponding channel length devices. Directly after the silver deposition a self assembled monolayer (SAM) treatment is used to favourably alter the work function of the electrode so that the contact to the polymer is ohmic. The substrate is immersed in the SAM treatment, which is pentafluorobenzene thiol in IPA (5 mM) for 30 sec, then rinsed with IPA. The SAM treatment should be conducted as soon as possible after evaporation to avoid unwanted build up of contaminants from the air. The organic semiconductor (OSC) is then spin coated from toluene (5 mg/ml) at 500 3 sec then 2000 rpm for 30 sec then annealed at 100 C for 1 min on a Hot Plate. Once the substrate has cooled a low K dielectric (aim 1 um) is spin coated onto the substrate, annealed at 100 C for 1 minute and finally a gate electrode is thermally deposited to a thickness of about 30 nm.

Transistor devices are prepared by using as semiconductor one of polymers P1-P3 or C1-C5, respectively. The transistor properties are characterised as follows:

The performance of transistors are characterised by calculating the mobility and device characteristics from the transfer curves. For all measurements, FET channel lengths (L) of 50 microns and channel widths (W) of 1,000 microns are used. FET characterization is carried out using an Agilent 4155C semiconductor parameter analyser.

Field-effect mobilities are extracted in the linear regime from the slope of the source-drain current in the linear regime ($I_{linsd}$) versus the gate voltage ($V_g$) ($I_{linsd}$ versus $V_g$ plots), and in the saturation regime are calculated from the linear fit of $I_{satsd}$ versus $V_g$ (where $I_{satsd}$ is the source-drain current in the saturation regime).

The results are summarized in Table 1 below.

TABLE 1

| No. | Material | sat. mobility [cm$^2$/Vs] | lin. mobility [cm$^2$/Vs] |
|---|---|---|---|
| 1 | P1 | 0.25 | 0.15 |
| 2 | P2 | 0.16 | |
| 3 | P3 | 0.07 | |
| 4 | C1 | $5 \times 10^{-4}$ | $5 \times 10^{-4}$ |
| 5 | C2 | $1 \times 10^{-6}$ | $1 \times 10^{-6}$ |
| 6 | C3 | $4 \times 10^{-5}$ | |
| 7 | C4 | $4 \times 10^{-5}$ | |
| 8 | C5 | $4 \times 10^{-3}$ | |

It can be seen from Table 1 that the use of polymers P1-P3 according to the invention, which do not comprise amine-containing units, leads to a significantly higher mobility, both in the saturated and the linear regime, compared to polymers C1-C5 which comprise amine-containing units.

The invention claimed is:

1. A conjugated polymer, comprising at least one unit of formula I and at least one unit of formula II

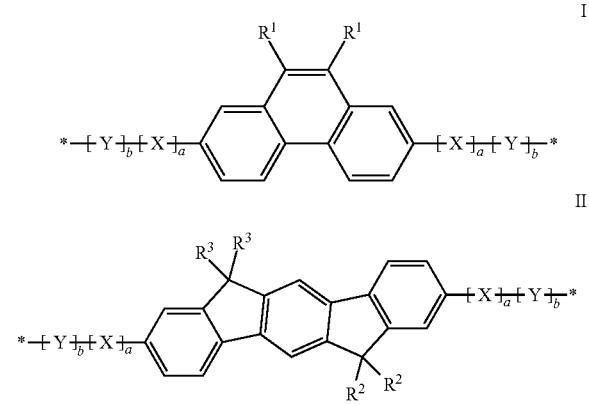

wherein
$R^1$ on each occurrence identically or differently, denotes H, a straight-chain, branched or cyclic alkyl group having 1 to 40 C atoms, which is unsubstituted or substituted by one or more groups R, and in which one or more C atoms are optionally replaced by O, S, CO, CO—O, O—CO, O—CO—O, CR=CR or C≡C such that O- and/or S-atoms are not linked directly to each other, and in which one or more H atoms are optionally replaced by F, Cl, Br, I or CN, or $R^1$ denotes an aryl or heteroaryl group having 2 to 40 C atoms that is unsubstituted or substituted by one or more groups R, or a combination of a plurality of these groups; and wherein two groups $R^1$ may form a further mono- or polycyclic, aliphatic group with one another, $R^{2,3}$ independently of each other have one of the meanings given for $R^1$, X, Y on each occurrence identically or differently, and independently of each other, denote CR=CR, C≡C or a divalent aryl or heteroaryl group having 2 to 40 C atoms that is unsubstituted or substituted by one or more groups $R^1$, R is on each occurrence, identically or differently, H, a straight-chain, branched or cyclic alkyl or alkoxy group having 1 to 22 C atoms, in which one or more C atoms are optionally replaced by O, S, CO, CO—O, O—CO, O—CO—O, CR$^0$=CR$^0$, C≡C such that O- and/or S-atoms are not linked directly to each other, and in which one or more H atoms are optionally replaced by F, Cl, Br, I or CN, or R is an aryl, heteroaryl, aryloxy or heteroaryloxy group having 5 to 40 C atoms that is unsubstituted or substituted by one or more non-aromatic group R$^0$; wherein two or more of the groups R may form a ring system with one another and/or with R$^0$; or R is F, Cl, Br, I, CN, Sn(R$^0$)$_3$, Si(R$^0$)$_3$ or B(R$^0$)$_2$, R$^0$ is on each occurrence, identically or differently, H or an aliphatic or aromatic hydrocarbon group having 1 to 20 C atoms; wherein two groups R$^0$ may form a ring together with the hetero atom to which they are attached, and a,b on each occurrence identically or differently, and independently of each other, denote 0, 1 or 2, wherein the polymer does not contain a diarylamine or triarylamine group.

2. A polymer according to claim 1, which does not contain a repeating unit which contains an amine or imine group.

3. A polymer according to claim 1, wherein the at least one unit of formula I is one of the following formulae

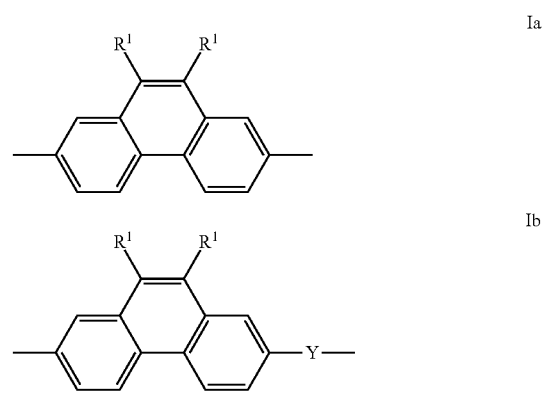

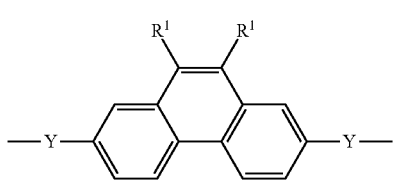

Ic wherein R¹ and Y are as defined for the at least one unit of formula I.

4. A polymer according to claim 1, wherein the at least one unit of formula II is one of the following formulae

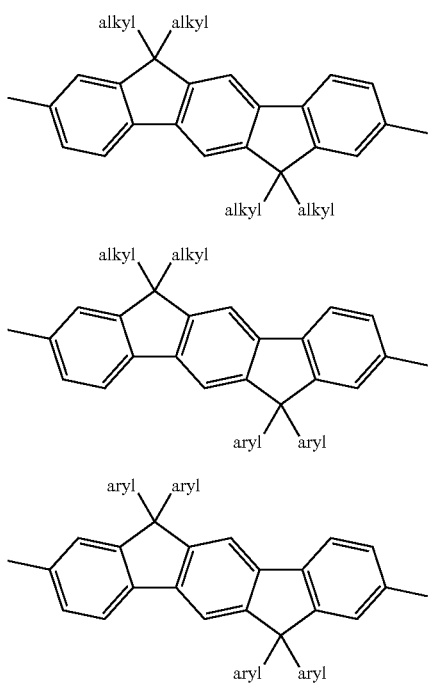

wherein the units are linked to adjacent units in the polymer via the 2,8-positions of the indenofluorene units, as indicated via the terminal bonds, wherein possible substituents on $R^{2,3}$ groups are not shown, "alkyl" means an aliphatic alkyl group, and "aryl" means an aryl or heteroaryl group as described for R¹ for the at least one unit of formula I.

5. A polymer according to claim 1, which is of formula IIIa

-[A-B]$_n$-    IIIa wherein A is a unit of formula I, B is a unit of formula II, and n is an integer >1.

6. A polymer blend, comprising one or more polymers according to claim 1 and one or more further polymers.

7. A formulation, comprising one or more polymers according to claim 1 and optionally one or more further polymers or monomers and one or more solvents.

8. A charge transport, semiconducting, electrically conducting or photoconducting material in an optical, electrooptical, electronic, electroluminescent or photoluminescent component of device comprising a polymer according to claim 1.

9. An optical, electrooptical or electronic component or device, comprising one or more polymers according to claim 1.

10. A component or device according to claim 9, selected from the group consisting of organic field effect transistors (OFET), thin film transistors (TFT), integrated circuits (IC), logic circuits, capacitors, radio frequency identification (RFID) tags, organic light emitting diodes (OLED), organic light emitting transistors (OLET), flat panel displays, backlights of displays, organic photovoltaic (OPV) devices, solar cells, laser diodes, photoconductors, photodetectors, electrophotographic devices, electrophotographic recording devices, organic memory devices, sensor devices, charge injection layers, charge transport layers in polymer light emitting diodes (PLEDs), interlayers in polymer light emitting diodes (PLEDs), Schottky diodes, planarising layers, antistatic films, polymer electrolyte membranes (PEM), conducting substrates, conducting patterns, electrode materials in batteries, alignment layers, biosensors, biochips, security markings, security devices, components for detecting and discriminating DNA sequences, and devices for detecting and discriminating DNA sequences.

11. A process for preparing a polymer according to claim 1, comprising aryl-aryl coupling one or more monomers according to formula IV $R^7$-A-$R^8$    IV wherein A is a unit of formula I, and $R^7$ and $R^8$ denote independently of each other halogen, —CH$_2$Cl, —CHO, —CH=CH$_2$—SiR'R''R''', —SnR'R''R''', —BR'R'', —B(OR')(OR''), —B(OH)$_2$, or a leaving group, wherein R¹, R'' and R''' have independently of each other one of the meanings of $R^2$ given for the at least one unit of formula II, or denote halogen, and R' and R'' may also form a ring together with the hetero atom to which are attached, and one or more monomers of formula V $R^7$—B—$R^8$    V wherein B is a unit of formula II, and $R^{7,8}$ are as defined in formula IV.

12. A polymer according to claim 1, wherein
R¹ on each occurrence identically or differently, denotes H, a straight-chain, branched or cyclic alkyl group having 1 to 40 C atoms, which is unsubstituted or substituted by one or more groups R, and in which one or more C atoms are optionally replaced by O, S, CO, CO—O, O—CO, O—CO—O, CR=CR or C≡C such that O- and/or S-atoms are not linked directly to each other, and wherein heteroatoms are not bonded directly to the phenanthrene unit in formula I, and in which one or more H atoms are optionally replaced by F, Cl, Br, I or CN, or R¹ denotes an aryl or heteroaryl group having 2 to 40 C atoms that is unsubstituted or substituted by one or more groups R, or a combination of a plurality of these groups; and wherein two groups R¹ may form a further mono- or polycyclic, aliphatic group with one another.

13. A polymer according to claim 1, wherein
R¹ on each occurrence identically or differently, denotes H, a straight-chain, branched or cyclic alkyl group having 1 to 40 C atoms, which is unsubstituted or substituted by one or more groups R, and in which one or more C atoms are optionally replaced by O, S, CO, CO—O, O—CO, O—CO—O, CR=CR or C≡C such that O- and/or S-atoms are not linked directly to each other, and in which one or more H atoms are optionally replaced by F, Cl, Br, I or CN, or R¹ denotes an aryl or heteroaryl group having 2 to 40 C atoms that is unsubstituted or substituted by one or more groups R, and wherein two groups $R^1$ may form a further mono- or polycyclic, aliphatic group with one another.

14. A polymer according to claim 3, wherein
$R^1$ on each occurrence identically or differently, denotes H, a straight-chain, branched or cyclic alkyl group having 1 to 40 C atoms, which is unsubstituted or substituted by one or more groups R, and in which one or more C atoms are optionally replaced by O, S, CO, CO—O, O—CO, O—CO—O, CR═CR or C≡C such that O- and/or S-atoms are not linked directly to each other, and wherein heteroatoms are not bonded directly to the phenanthrene unit in formula I, and in which one or more H atoms are optionally replaced by F, Cl, Br, I or CN, or $R^1$ denotes an aryl or heteroaryl group having 2 to 40 C atoms that is unsubstituted or substituted by one or more groups R, or a combination of a plurality of these groups; and wherein two groups $R^1$ may form a further mono- or polycyclic, aliphatic group with one another.

15. A polymer according to claim 3, wherein
$R^1$ on each occurrence identically or differently, denotes H, a straight-chain, branched or cyclic alkyl group having 1 to 40 C atoms, which is unsubstituted or substituted by one or more groups R, and in which one or more C atoms are optionally replaced by O, S, CO, CO—O, O—CO, O—CO—O, CR═CR or C≡C such that O- and/or S-atoms are not linked directly to each other, and in which one or more H atoms are optionally replaced by F, Cl, Br, I or CN, or $R^1$ denotes an aryl or heteroaryl group having 2 to 40 C atoms that is unsubstituted or substituted by one or more groups R, and wherein two groups $R^1$ may form a further mono- or polycyclic, aliphatic group with one another.

16. A polymer according to claim 4, wherein the at least one unit of formula I is one of the following formulae

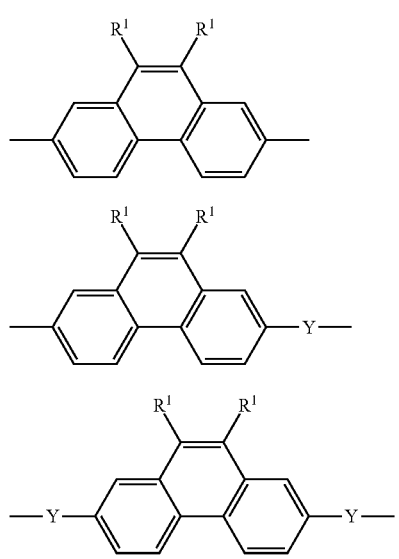

wherein $R^1$ and Y are as defined for the at least one unit of formula I.

17. A polymer according to claim 16, wherein
$R^1$ on each occurrence identically or differently, denotes H, a straight-chain, branched or cyclic alkyl group having 1 to 40 C atoms, which is unsubstituted or substituted by one or more groups R, and in which one or more C atoms are optionally replaced by O, S, CO, CO—O, O—CO, O—CO—O, CR═CR or C≡C such that O- and/or S-atoms are not linked directly to each other, and wherein heteroatoms are not bonded directly to the phenanthrene unit in formula I, and in which one or more H atoms are optionally replaced by F, Cl, Br, I or CN, or $R^1$ denotes an aryl or heteroaryl group having 2 to 40 C atoms that is unsubstituted or substituted by one or more groups R, or a combination of a plurality of these groups; and wherein two groups $R^1$ may form a further mono- or polycyclic, aliphatic group with one another.

18. A polymer according to claim 16, wherein
$R^1$ on each occurrence identically or differently, denotes H, a straight-chain, branched or cyclic alkyl group having 1 to 40 C atoms, which is unsubstituted or substituted by one or more groups R, and in which one or more C atoms are optionally replaced by O, S, CO, CO—O, O—CO, O—CO—O, CR═CR or C≡C such that O- and/or S-atoms are not linked directly to each other, and in which one or more H atoms are optionally replaced by F, Cl, Br, I or CN, or $R^1$ denotes an aryl or heteroaryl group having 2 to 40 C atoms that is unsubstituted or substituted by one or more groups R, and wherein two groups $R^1$ may form a further mono- or polycyclic, aliphatic group with one another.

19. A polymer according to claim 1, wherein the at least one unit of formula II is of the following formula

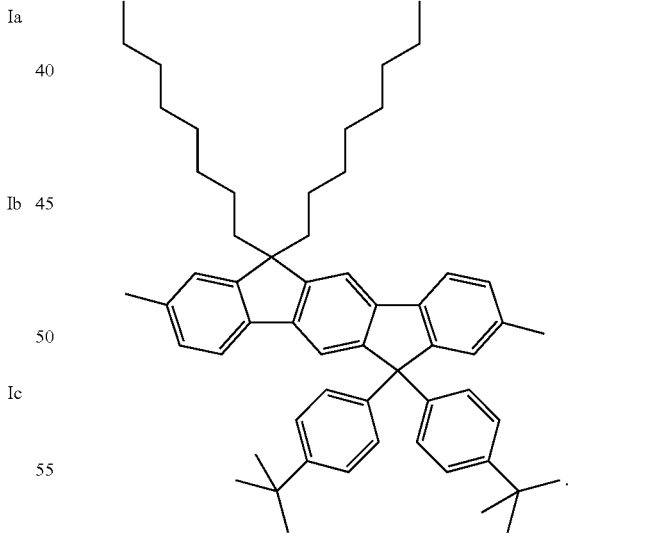

* * * * *